United States Patent
Ng et al.

(10) Patent No.: US 6,709,918 B1
(45) Date of Patent: Mar. 23, 2004

(54) METHOD FOR MAKING A METAL-INSULATOR-METAL (MIM) CAPACITOR AND METAL RESISTOR FOR A COPPER BACK-END-OF-LINE (BEOL) TECHNOLOGY

(75) Inventors: Chit Hwei Ng, Singapore (SG); Jian Xun Li, Singapore (SG); Kok Wai Chew, Singapore (SG); Tjin Tjin Tjoa, Singapore (SG); Chaw Sing Ho, Singapore (SG); Shao Fu Sanford Chu, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/307,674

(22) Filed: Dec. 2, 2002

(51) Int. Cl.⁷ .................... H01L 21/8242; H01L 21/20; H01L 21/4763; H01L 21/44
(52) U.S. Cl. .................. 438/253; 438/393; 438/638; 438/672; 438/959
(58) Field of Search .................... 438/250, 253, 438/288, 384, 393, 628, 638, 672, 675, 959; 257/306

(56) References Cited

U.S. PATENT DOCUMENTS

| 6,117,747 A | * | 9/2000 | Shao et al. | 438/396 |
|---|---|---|---|---|
| 6,271,084 B1 | | 8/2001 | Tu et al. | 438/253 |
| 6,320,244 B1 | | 11/2001 | Alers et al. | 257/534 |
| 6,329,234 B1 | | 12/2001 | Ma et al. | 438/210 |
| 6,500,724 B1 | * | 12/2002 | Zurcher et al. | 438/384 |

OTHER PUBLICATIONS

Interconnect Tech. Conf. 2000 Proceedings of the IEEE 2000, pp. 111–113, "Single Mask Metal–Insulator–Metal (MIM) Capacitor with Copper Damascene Metalization Sub–0.18μm Mixed Mode Signal and System–on–a Chip (SoC) Applications, " R. Liu et al.

IEEE/IEDM 2000 Proceedings, pp. 153–156, "Integration of Thin Film MIM Capacitors and Resistors into Copper Metallization based RF–CMOS and Bi–CMOS Technologies", Zurcher et al.

"A High Reliability Metal Insulator Metal Capacitor for 0.18μm Copper Technology," Armacost et al., Proc. IEEE/IEDM 2000, pp. 157–160.

Proceeding IEEE/IEDM 1999, pp. 849–852, Mahnkopf et al., "System on a Chip Technology Platform for 0.18 μm Digital, Mixed Signal & DRAM Applications."

* cited by examiner

*Primary Examiner*—W. David Coleman
*Assistant Examiner*—William M. Brewster
(74) *Attorney, Agent, or Firm*—George O. Saile; Rosemary L. S. Pike

(57) ABSTRACT

A method for making concurrently metal-insulator-metal (MIM) capacitors and a metal resistors in a Cu damascene back-end-of-line process is achieved. The method forms a Cu capacitor bottom metal plate using a dual-damascene process. A $Si_3N_4$ or SiC is deposited to form a capacitor dielectric layer on the Cu bottom plate. A metal layer having an upper etch-stop layer is deposited and patterned to form concurrently capacitor top plates and metal resistors. The patterning is terminated in the capacitor dielectric layer to prevent Cu particle contamination. An insulating layer is deposited and via holes are etched to the capacitor top plates and the metal resistors using the upper etch-stop layer to prevent overetching and damage. The method provides a MIM capacitor using only one additional photoresist mask while improving process yield.

30 Claims, 3 Drawing Sheets

METHOD FOR MAKING A METAL-INSULATOR-METAL (MIM) CAPACITOR AND METAL RESISTOR FOR A COPPER BACK-END-OF-LINE (BEOL) TECHNOLOGY

BACKGROUND OF THE INVENTION

(1) Field of the Invention

The present invention relates to a method for making semiconductor integrated circuits, and more particularly a method for making metal-insulator-metal (MIM) capacitors and concurrently making resistor structures compatible with a copper (Cu) metallization scheme requiring only a single additional masking step. This simplified method is designed to prevent via punchthrough to the top electrode. This novel method also retains the utilization of the capacitor dielectric layer as an etch-stop layer to prevent overetching the copper bottom plate that causes copper particle, and thereby avoiding additional processing steps. The MIM capacitors can be used in an integrated circuit as anti-fuse devices.

(2) Description of the Prior Art

Capacitors are used for various integrated circuit applications. For example, making metal-insulator-metal (MIM) capacitors can be used for mixed signal (analog/digital circuits) applications and radio frequency (RF) circuits, and can also serve as decoupling capacitors to provide improved voltage regulation and noise immunity for power distribution.

In previous generations of semiconductor technology, these capacitors are integrated into the semiconductor circuit when the semiconductor devices are formed on the substrate. For example, the one or two doped patterned polysilicon layers used to make the field effect transistors (FETS) and/or bipolar transistors can also be used to form the capacitors. Alternatively, the capacitors can be fabricated using the multilevels of interconnecting metal patterns (e.g., Al/Cu) used to wire up the individual semiconductor devices (FETs).

In recent years the AlCu metallization has been replaced with copper (Cu) to reduce significantly the resistivity of the conductive metal lines and thereby improve the RC (resistance×capacitance) delay time for improved circuit performance. By using Cu lines, the resistance in series with MIM capacitors is reduced resulting in a higher figure of merit Q ($X_c$/R), where $X_c$ is the capacitor reactance expressed in ohms, and R is the resistance (ohms).

Several methods of making MIM capacitors are described in the literature. One method is described in the Interconnect Technology Conference 2000 Proceedings of the IEEE 2000, page 111, in a paper entitled "Single Mask Metal-Insulator-Metal (MIS) Capacitor with Copper Damascene Metallization for Sub-0.18 $\mu$m Mixed Mode Signal and System-on-a-Chip (SoC) Applications" by R. Liu et al., Lucent Technologies Bell Laboratories in which a Cu damascene process is used to form the bottom electrode and then a $Si_3N_4$ dielectric is deposited as the capacitor dielectric and as a barrier layer. A conducting material such as TiN, AlCu/TiN, or Ti/TiN/AlCu/TiN is deposited and is patterned by selective etching to stop on the $Si_3N_4$ layer to form the top electrode. The paper does not address forming a metal resistor or making contacts to the top electrode. In the Proceedings of the IEEE/IEDM 2000, page 153, a paper entitled "Integration of Thin Film MIM Capacitors and Resistors into Copper Metallization based RF-CMOS and Bi-CMOS Technologies" by P. Zurcher et al. of Motorola describes a method for making a MIM capacitor and a metal resistor using a Cu dual-damascene process and forming a bottom electrode of TaN, forming a $Si_3N_4$ capacitor dielectric layer and a top electrode also formed from TaN. The bottom electrode TaN layer is also patterned to form resistors. A second damascene process is then used to make contacts to the capacitor top electrode and to the resistor and to the underlying metal layers. Other methods of forming MIM capacitors include a paper by M. Armacost et al. of IBM entitled "A High Reliability Metal Insulator Metal Capacitor for 0.18 $\mu$m Copper Technology" in the Proceedings of the IEEE/IEDM 2000, page 157, and in the Proceedings of the IEEE/IEDM 1999, page 849, R. Mahnkopf et al. of Infineon and IBM describe a method for making a MIM capacitor in a Cu dual-damascene metallization scheme in a paper entitled "'System on a Chip' Technology Platform for 0.18 $\mu$m Digital, Mixed Signal & eDRAM Applications."

Several patents have been issued for making MIM capacitors. U.S. Pat. No. 6,117,747 to Shao et al. describes a method that utilizes an additional thin metal layer to form a bottom capacitor plate which extends over the edge of a Cu dual-damascene structure. Ma et al., U.S. Pat. No. 6,329,234 B1, describe a method for making a MIM capacitor structure and concurrently an inductor using a single photoresist mask for high-frequency mixed-signal Rf, CMOS applications compatible with a Cu dual-damascene process. U.S. Pat. No. 6,320,244 B1 to Alers et al. describes a method for integrating MIM capacitors with a Cu dual-damascene process. The capacitor is formed in a recess in an insulating layer over an underlying interconnect structure of the integrated circuit. Tu et al. in U.S. Pat. No. 6,271,084 B1 describe a method for making vertical MIM capacitors using a damascene process in which the vertical sidewalls of the capacitor are used to increase the capacitance.

There is still a need in the semiconductor industry to form metal-insulator-metal (MIM) capacitors with high capacitance while improving process yield and product reliability.

SUMMARY OF THE INVENTION

A principal object of the present invention is to fabricate a Metal-Insulator-Metal (MIM) capacitor and concurrently make a resistor structure compatible with a copper (Cu) metallization scheme, requiring only one additional masking step.

A second object of this invention is to avoid particle generation by patterning the top plate by etching down to and partially into an interelectrode dielectric layer thereby avoiding etching the Cu bottom plate.

A third objective of this invention is to use a Cu bottom plate to reduce series resistance and thereby improve the figure of merit Q ($X_c$/R).

Still another objective is to provide an etch-stop layer on the capacitor top plate to prevent via punchthrough to the top plate when via holes are etched through an overlying insulating layer to the capacitor top plate.

A further objective is to incorporate the MIM capacitor into the circuit design to form an anti-fuse, which can then be shorted by applying a voltage between the capacitor plates that is greater than the dielectric breakdown voltage of the capacitor.

The present invention is a method for making improved MIM capacitors using one additional masking step and is compatible with concurrently making metal resistors. This novel process eliminates damage to the capacitor when making via holes through an insulating layer to the top plate of the capacitor. Since the bottom plate is formed from a low-resistance metal (Cu), the figure of merit Q ($X_c/R$) is increased significantly. Although the method is described using a dual-damascene process, it should be understood that a single-damascene process can also be used.

In sugary the method of this invention begins by providing a semiconductor substrate having partially completed semiconductor circuits, such as FETs and the like, and includes at least one level of metal interconnections embedded in, and coplanar with a first insulating layer. A dual-damascene process is used to form concurrently the bottom plate of the capacitor integrated with the next level of interconnections. The dual-damascene process comprises forming a first etch-stop layer on the first insulating layer, depositing a second insulating layer, depositing a second etch-stop layer, depositing a third insulating layer. First and second recesses are formed in the third insulating layer to the second etch-stop layer. The first recesses are for capacitor bottom plates, and the second recesses are for metal lines. Next, first via holes are etched in the second etch-stop layer and in the second insulating layer exposed within the recesses to the first etch-stop layer. The second etch-stop layer is removed in the first via holes to the underlying metal interconnections. A conformal first barrier layer is deposited and a first copper seed layer is deposited. A first copper layer is electroplated and polished back to form capacitor bottom plates in the first recesses, and to form the metal lines in the second recesses, and to form interlevel electrical interconnections in the first via holes. A relatively thin capacitor dielectric layer, such as silicon nitride or silicon carbide, is deposited on the second insulating layer and over the capacitor bottom plates. A pre-silicon nitride treatment in ammonium (NH3) followed by a brief exposure to $SiH_4$+ $NH_3$ is used prior to the $Si_3N_4$ deposition to prevent Cu hillock formation on the capacitor bottom plate. The thickness of the capacitor dielectric layer is used to control the value of the capacitance. A metal layer is deposited on the capacitor dielectric layer, and a third etch-stop layer is deposited on the metal layer for the top plate. A photoresist mask and plasma etching are used to pattern the third etch-stop layer and the metal layer to form the capacitor top plates. For example, the top plates are preferably formed from tantalum (Ta). The etching is terminated in the capacitor dielectric layer (also buffer layer) to prevent etching into the underlying Cu bottom plates. During formation of the capacitor top plates, the etching is terminated (about 100 Angstroms) within the capacitor dielectric layer to avoid overetching into the Cu capacitor bottom plates that would otherwise result in unwanted Cu particle contamination. A key feature of this invention is to use the photoresist masking and plasma etching that form the capacitor top plates to concurrently form the metal resistors. The metal layer for the capacitor top plates and for resistors can be varied in thickness to vary the resistance for design purposes. A relatively thick blanket fourth insulating layer is deposited on the substrate to electrically insulate the underlying metallurgy. Second via holes are etched in the fourth insulating layer to the third etch-stop layer on the capacitor top plates and on the metal resistors. Another key feature is the inclusion of the third etch-stop layer to prevent overetching the second via holes and damaging the capacitors. The thin third etch-stop layer is selectively removed in the second via holes. A single damascene process is used to form interlevel contacts in the second via holes. In this process step a second barrier layer and a second seed layer are deposited, and a second copper layer is electroplated and polished back to form the interlevel contacts (Cu plugs) in the second via holes. To complete the remaining levels of electrical interconnections a standard copper metal-line-and-interconnect process can be used, for example, by repeating the damascene process. Alternatively, a dual-damascene process can be used in which the second via holes and recesses for the metal lines are formed, and then filled with Cu to reduce process costs.

BRIEF DESCRIPTION OF THE DRAWINGS

The objects and other advantages of this invention are best understood with reference to the preferred embodiment when read in conjunction with the following drawings.

DESCRIPTION OF THE PREFERRED EMBODIMENT

The present invention relates to a method for making a metal-insulator-metal (MIS) capacitor and concurrently making a metal resistor for Cu back-end-of-line process utilizing only one additional masking step. The metal layer patterned to form the capacitor top plates is also patterned to form metal resistors. The thickness of the top plate can be varied to determine the sheet resistance of the resistor without affecting the capacitance of the MIM.

Figure 1:
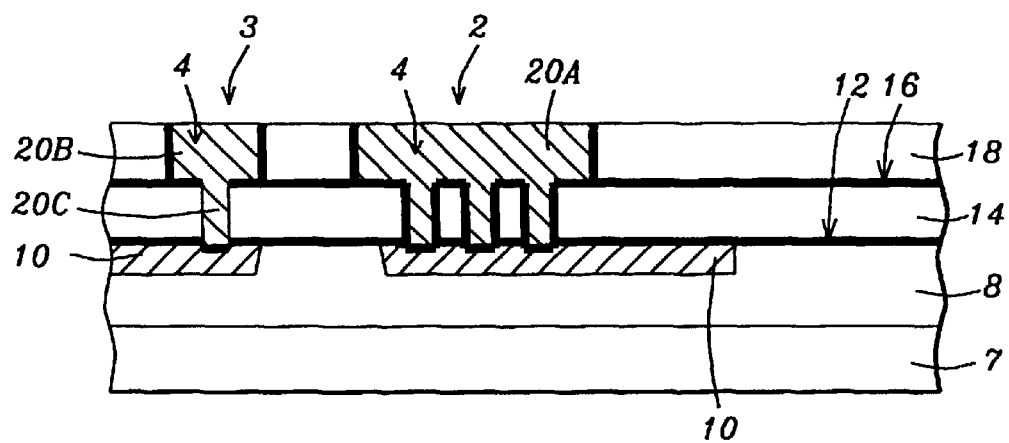
FIGS. 1 through 7 are schematic cross-sectional views of a portion of a substrate showing the sequence of process steps for making a MIM capacitor and a metal resistor by the method of this invention.

Referring to FIG. 1, the method begins by providing a semiconductor substrate 7 having partially completed semiconductor circuits, such as FETs and the like. The partially completed devices are not shown in the figures to simplify the drawings. The substrate is typically a single-crystal silicon having a <100>crystallographic orientation, although the invention is applicable to other semiconductor substrates such as GaAs, SiGe, and the like. A first insulating layer 8 is formed on a principal surface of the substrate 7. At least one level of metal interconnections 10 are embedded in, and are coplanar with the first insulating layer 8. A first etch-stop layer 12 is formed on the first insulating layer 8. Layer 12 is preferably silicon nitride ($Si_3N_4$), deposited by plasma-enhanced chemical vapor deposition (PECVD) to a thickness of between about 100 and 1000 Angstroms, and more specifically to a thickness of about 600 Angstroms. A second insulating layer 14 is deposited. The second insulating layer is typically silicon oxide ($SiO_2$) deposited by PECVD using, for example, tetraethosiloxane (TEOS) as the reactant gas. Layer 14 is formed to a thickness of between about 1000 and 10000 Angstroms, and more specifically to a thickness of about 5000 Angstroms. A second etch-stop layer 16 is deposited on the second insulating layer 14. Layer 16 is preferably $Si_3N_4$, deposited by PECVD to a thickness of between about 100 and 1000 Angstroms, and more specifically to a thickness of about 600 Angstroms. A third insulating layer 18 is then deposited. Layer 18 is $SiO_2$, also deposited by PECVD using TEOS, and is deposited to a thickness of between about 1000 and 10000 Angstroms, and more specifically to a thickness of about 5000 Angstroms.

Still referring to FIG. 1, conventional photolithographic techniques and anisotropic plasma etching are used to etch first recesses 2 for capacitor bottom plates in the third insulating layer 18 to the second etch-stop layer 16, and concurrently second recesses 3 are etched for metal interconnections. Second photolithographic techniques and anisotropic plasma etching are used to etch first via holes 4 in the second etch-stop layer 16 and in the second insulating layer 14 exposed within the recesses 2 and 3 to the first etch-stop layer 12, and the first etch-stop layer 12 is removed in the first via holes 4 to expose the underlying metal interconnections 10. This dual-damascene process is completed by forming the metallurgy in the recesses 2 and 3 and in the first via holes 4. The metallurgy consists of depositing a thin barrier layer to prevent diffusion of Cu into the intermetal dielectric layers consisting of layers 14 and 18. This prevents the Cu from reacting with the underlying structure and provides an adhesion layer. A thin Cu seed layer is deposited, and Cu is electroplated sufficiently thick to fill the first via holes 4 and the recesses 2 and 3. The barrier layer and Cu seed layer are not depicted as separate layers to simplify the drawings. More specifically, the first barrier layer is preferably tantalum (Ta) deposited, for example, by physical vapor deposition (PVD) to a preferred thickness of between about 100 and 1000 Angstroms, and more specifically to a thickness of about 250 Angstroms. The thin first copper seed layer is deposited, for example, by PVD to a thickness of between about 500 and 2000 Angstroms, and more specifically to a thickness of about 1250 Angstroms. The electroplated first copper layer is then polished back to form capacitor bottom plates 20A in the first recesses 2, and to form the metal lines 20B in the second recesses 3, and to form interlevel electrical interconnections 20C in the first via holes 4 to complete the dual-damascene process.

Figure 2:
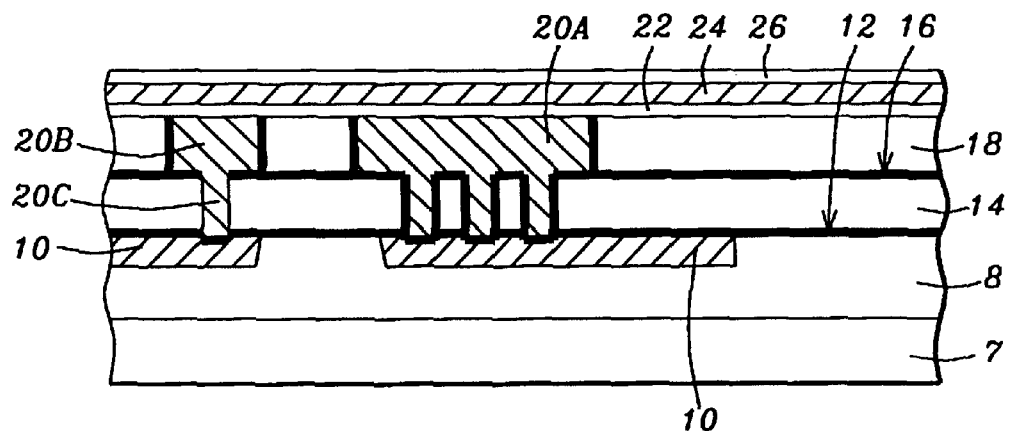

Referring to FIG. 2 and relating more specifically to the method of this invention, a relatively thin blanket capacitor dielectric layer 22 is deposited on the second insulating layer 18 and over the capacitor bottom plates 20A. Layer 22 is preferably $Si_3N_4$ deposited, for example, by a vapor deposition such as CVD, PECVD, or atmospheric vapor deposition. Alternatively, other dielectric materials, such as silicon carbide and the like, can be used for the capacitor dielectric layer 22. Layer 22 is deposited to a preferred thickness of between about 100 and 1000 Angstroms, and more specifically to a thickness of about 600 Angstroms. The thickness of the capacitor dielectric layer 22 is used to control the value of the capacitance. For example, a thickness of about 600 Angstroms results in a capacitance of about 1 femto-Farad per micrometer square ($fF/um^2$). To minimize hillock formation in the capacitor bottom plates 20A, a pre-$Si_3N_4$ treatment in ammonium ($NH_3$) followed by a brief exposure to $SiH_4+NH_3$ is used prior to the $Si_3N_4$ deposition to passivate the Cu surface. A metal layer 24 is deposited on the capacitor dielectric layer 22 for forming capacitor top plates and also for forming metal resistors. Layer 24 is preferably tantalum, and is deposited by PECVD to a thickness of between about 100 and 2000 Angstroms, and more specifically to a thickness of about 1000 Angstroms. Next a third etch-stop layer 26 is deposited on layer 24. Layer 26 is preferably $Si_3N_4$ and is deposited to a thickness of between about 100 and 1000 Angstroms, and more specifically to a thickness of about 500 Angstroms.

Figure 3:
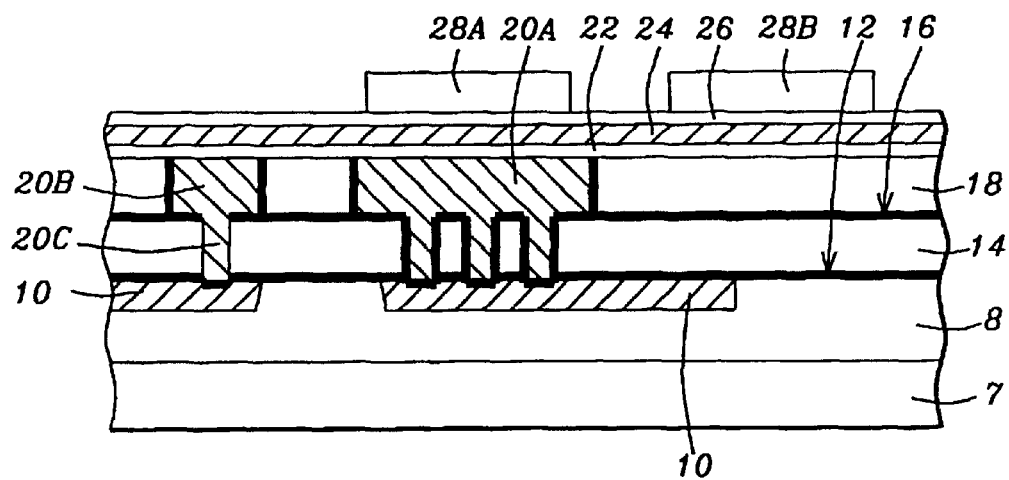

Referring to FIG. 3, a photoresist layer is formed on the third etch-stop layer 26. The photoresist layer is patterned to form portions 28A that are aligned over and within the capacitor bottom plate 20A for forming the capacitor top plates and to maximize circuit density, and to form portions 28B that are patterned for forming the metal resistors over the third insulating layer 18.

Figure 4:
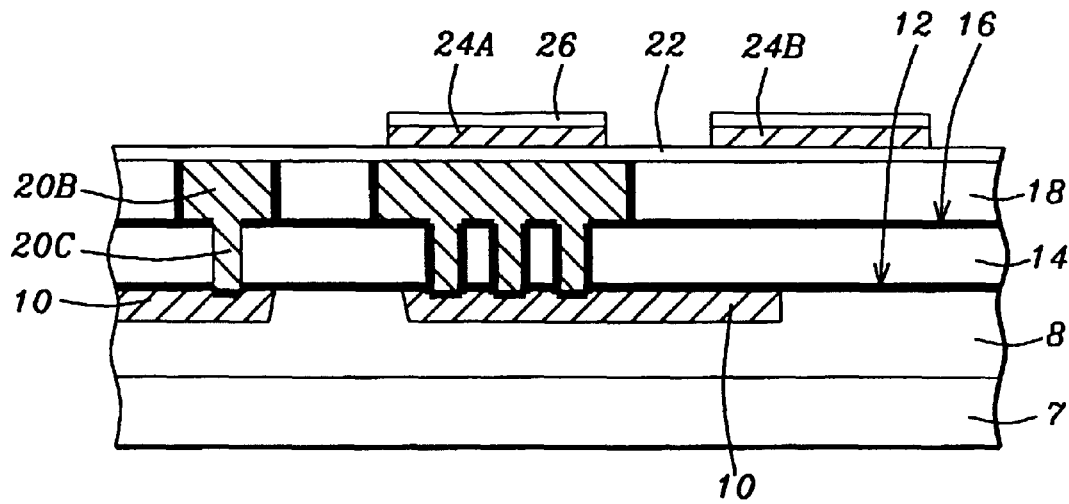

Referring to FIG. 4, using the patterned photoresist mask of FIG. 3, plasma etching is carried out to pattern the third etch-stop layer 26 and the metal layer 24 and to partially etch into the capacitor dielectric layer 22 resulting in the capacitor top plates 24A having an etch-stop layer 26 on the surfaces, and concurrently metal resistors 24B also having an etch-stop layer on the surfaces. The capacitor dielectric layer 22 also serves as a buffer or etch-stop layer to prevent overetching into the underlying Cu bottom plates 20A. More specifically, the etching is terminated (about 100 Angstroms) within the capacitor dielectric layer 22 to avoid overetching into the Cu capacitor bottom plate 20A that would otherwise result in unwanted Cu particle contamination. The etching is preferably carried out using reactive ion etching (RIE) and an etchant gas containing a halide compound such as $BCl_3$, $Cl_2$, $CF_4$, $SF_6$, $CH_2F_2$ and the like.

During deposition of the metal layer 24 for the capacitor top plates 24A and for the metal resistors 24B, the thickness can be varied to provide different sheet resistance for design purposes. The thickness of the capacitor top plate 24A can be varied without affecting the value of the capacitance.

Figure 5:
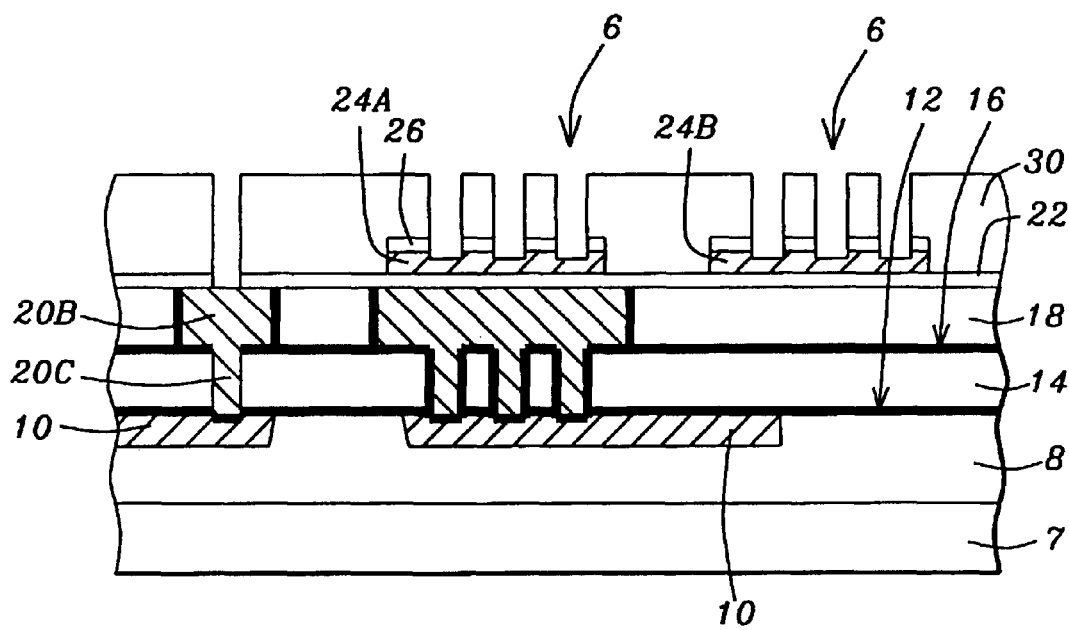

Referring to FIG. 5, after stripping the remaining patterned photoresist mask (28A, 28B), a relatively thick blanket fourth insulating layer 30 is deposited on the substrate to electrically insulate the underlying metallurgy and to minimize interlevel metal capacitance (coupling). The fourth insulating layer 30 is preferably $SiO_2$, deposited by PECVD to a preferred thickness of between about 1000 and 10000 Angstroms, and more specifically to a thickness of about 6000 Angstroms. Next, conventional photolithographic techniques are used to etch second via holes 6 in the fourth insulating layer 30 to the third etch-stop layer 26 on the capacitor top plates 24A and on the metal resistors 24B, while etching second via holes 6 to the underlying metal lines 20B. A key feature of the invention is that the third etch-stop layer 26 prevents overetching the second via holes 6 and damaging the capacitors. For example, one advantage is that the third etch-stop layer 26 compensates for overetching that results from non-uniform deposition of the fourth insulating layer 30 across the wafer. The thin etch-stop layer 26 exposed in the second via holes 6 is selectively removed to expose the capacitor top plates 24A.

Figure 6:
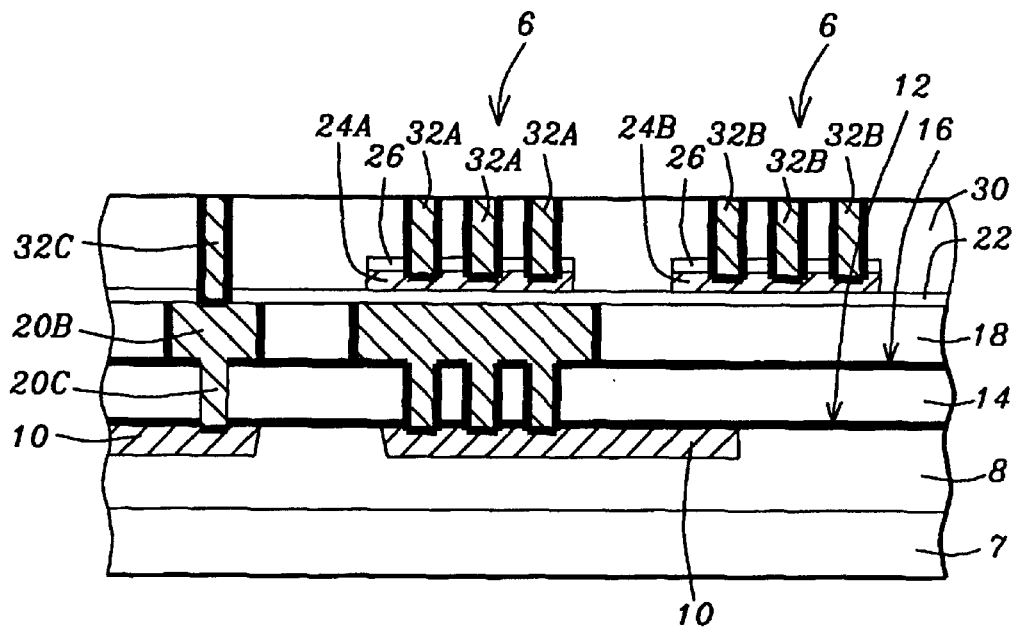

Referring to FIG. 6, Cu interlevel contacts are formed in the second via holes 6 to the capacitor top plates 24A and to the metal resistors 24B using a single damascene process. This damascene process involves depositing a second barrier layer (not shown) and a second Cu seed layer (not shown). More specifically, the thin second barrier layer, preferably Ta, is deposited, for example, by physical vapor deposition (PVD) to a preferred thickness of between about 100 and 1000 Angstrom, and more specifically to a thickness of about 300 Angstroms. The thin second copper seed layer is deposited, for example, by PVD to a thickness of between about 500 and 2000 Angstroms, and more specifically to a thickness of about 1250 Angstroms. Then a second copper layer is electroplated sufficiently thick to fill the second via holes 6, and is polished back to the surface of the fourth insulating layer 30 to form Cu interlevel contacts 32A to the capacitor top plates 24A, and to concurrently form Cu interlevel contacts 32B to the metal resistors 24B and Cu interlevel contacts 32C to the metal lines 20B.

Figure 7:
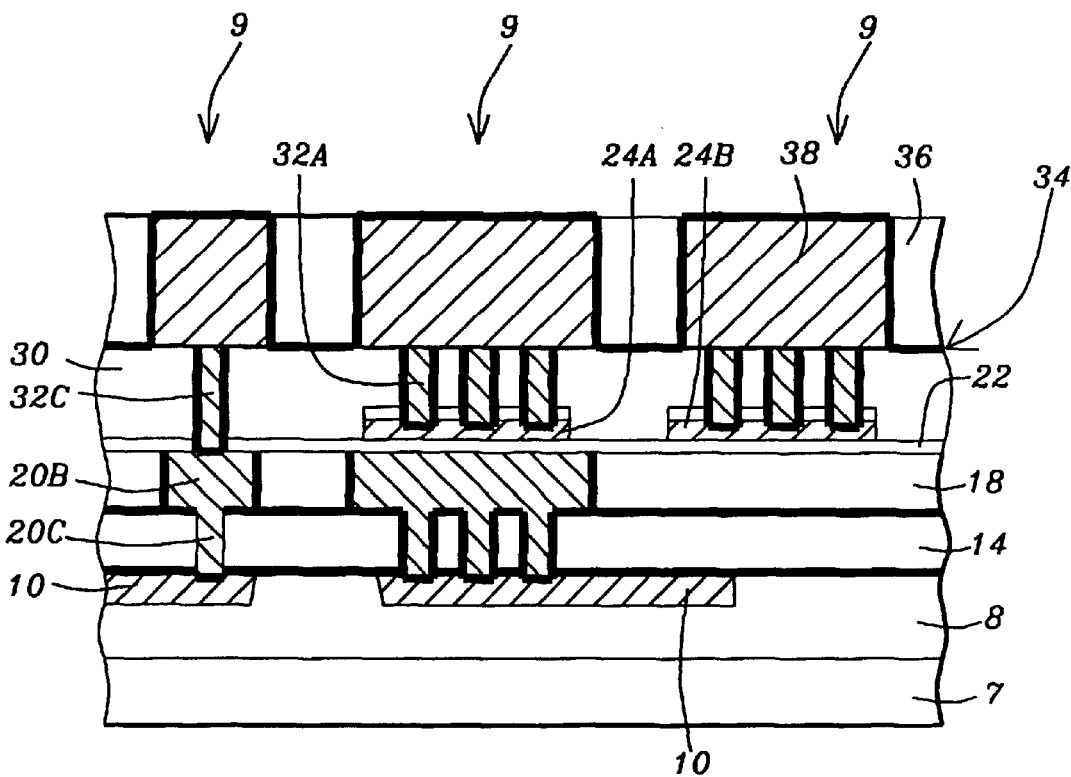

Referring to FIG. 7, the next level of metal interconnections 38 are formed by depositing another etch-stop layer 34 and a fifth insulating layer 36, and etching recesses 9 for metal lines in layer 36 to layer 34. The recesses 9 are then filled by forming a barrier layer (not shown), a Cu seed layer (not shown), and electroplating Cu 38. The electroplated Cu is then polished back to the fifth insulating layer 36 to form the next level of metal interconnections 38. The remaining levels of metallization to complete the electrical connections can be carried out by repeating single- and/or dual-damascene processes. A dual-damascene process is preferred to reduce processing steps and to be more cost-effective. However, when inductors are required in the circuit, a single-damascene process, as described in this invention, is required as depicted for layer 38 of FIG. 7.

These MIM capacitors can also be utilized as anti-fuse devices. By applying a voltage that is greater than the dielectric breakdown voltage for the capacitor dielectric layer between the top and bottom plates, the MIM capacitor can be electrically shorted thereby using the capacitor as an anti-fuse device.

While the invention has been particularly shown and described with reference to the preferred embodiment thereof, it will be understood by those skilled in the art that various changes in form and details may be made without departing from the spirit and scope of the invention.

What is claimed is:

1. A method for making metal-insulator-metal (MIM) capacitors on a substrate comprising the steps of:

providing said substrate having partially completed semiconductor circuits including at least one level of metal interconnections embedded in a first insulating layer;

forming consecutively a first etch-stop layer, a second insulating layer, a second etch-stop layer, and a third insulating layer, and using a dual-damascene process to form first and second recesses in said third insulating layer, and to for first via holes in said second insulating layer, and depositing a first barrier layer and a first copper layer, and polishing to form contacts in said first via holes and to form copper capacitor bottom plates in said first recesses and interlevel electrical interconnections in said second recesses coplanar with said third insulating layer;

depositing a capacitor dielectric layer, a metal layer, and a third etch-stop layer on said second insulating layer and over said capacitor bottom plates;

forming a photoresist mask and plasma etching said third etch-stop layer and said metal layer and partially etching into said capacitor dielectric layer to form capacitor top plates aligned over said capacitor bottom plates, and concurrently using said photoresist mask and said plasma etching to form metal resistors;

depositing a blanket fourth insulating layer on said substrate;

etching second via holes in said fourth insulating layer to said third etch-stop layer on said capacitor top plates and on said metal resistors, and selectively removing said third etch-stop layer in said second via holes;

depositing a second barrier layer and a second seed layer, and electroplating a second copper layer and polishing back to form interlevel contacts in said second via holes; and, using a standard copper metal-line-and-interconnect process to form the remaining electrical interconnections.

2. The method of clam 1, wherein said first insulating layer is silicon oxide deposited by plasma-enhanced chemical vapor deposition to a thickness of between about 1000 and 10000 Angstroms.

3. The method of claim 1, wherein said first and said second etch-stop layers are silicon nitride and are formed to a thickness of between about 100 and 1000 Angstroms.

4. The method of claim 1, wherein said second insulating layer is silicon oxide deposited by plasma-enhanced chemical vapor deposition to a thickens of between about 2000 and 10000 Angstroms.

5. The method of claim 1, wherein said third insulating layer is silicon oxide deposited by plasma-enhanced chemical vapor deposition to a thickens of between about 1000 and 10000 Angstroms.

6. The method of claim 1, wherein said first and said second barrier layers are tantalum and are formed to a thickness of between about 100 and 1000 Angstroms, and wherein said first and said second seed layers are formed to a thickness of between about 500 and 2000 Angstroms.

7. The method of claim 1, wherein said first copper layer is electroplated to a thickness sufficient to fill said first and said second recesses, and is polished back to said third insulating layer.

8. The method of claim 1, wherein said capacitor dielectric layer is a material selected from the group that includes silicon nitride, silicon carbide, silicon dioxide, nitrogen-doped silicon carbide, and oxygen-doped silicon carbide and is formed to a thickness of between about 100 and 1000 Angstroms.

9. The method of claim 1, wherein said metal layer is tantalum deposited by physical vapor deposition to a thickness of between about 100 and 1000 Angstroms.

10. The method of claim 1, wherein said third etch-stop layer in silicon nitride and is formed to a thickness of between about 100 and 1000 Angstroms.

11. The method of claim 1, wherein said capacitor dielectric layer is partially etched to a depth of about 100 to 1000 Angstroms.

12. The method of claim 1, wherein said fourth insulating layer is silicon oxide deposited by plasma-enhanced chemical vapor deposition to a thickness of between about 1000 and 10000 Angstroms.

13. The method of claim 1, wherein said second via holes are etched selectively to said third insulating layer on said capacitor top plates using anisotropic plasma etching having an etch selectivity between silicon oxide and silicon nitride of about 15:1.

14. The method of claim 1, wherein said second copper layer is electroplated to a thickness sufficient to fill said second via holes, and is polished back to said fourth insulating layer.

15. A method for making metal-insulator-metal (MIM) capacitors on a substrate comprising the steps of:

providing said substrate having partially completed semiconductor circuits including at least one level of metal interconnections embedded in a first insulating layer;

depositing a first etch-stop layer on said first insulating layer;

depositing a second insulating layer and depositing a second etch-stop layer;

depositing a third insulating layer;

forming first and second recesses in said third insulating layer to said second etch-stop layer, said first recesses for capacitor bottom plates and said second recesses for metal lines;

forming first via holes in said second etch-stop layer and in said second insulating layer exposed in said recesses to said first etch-stop layer;

removing said second etch-stop layer in said first via holes to said metal interconnections;

depositing a first barrier layer, a first copper seed layer;

forming a first copper layer by electroplating and polishing back to form capacitor bottom plates in said first recesses and to form said metal lines in said second recesses, and to form interlevel electrical interconnections in said first via holes;

depositing a capacitor dielectric layer, a metal layer, and a third etch-stop layer on said second insulating layer and over said capacitor bottom plates;

forming a photoresist mask and plasma etching said third etch-stop layer and said metal layer and partially etching into said capacitor dielectric layer to for capacitor top plates aligned over said capacitor bottom plates; and concurrently using said photoresist mask and said plasma etching to form metal resistors;

depositing a blanket fourth insulating layer on said substrate;

etching second via holes in said fourth insulating layer to said third etch-stop layer on said capacitor top plates and on said metal resistors, and selectively removing said third etch-stop layer in said second via holes;

depositing a second barrier layer, a second seed layer and electroplating a second copper layer and polishing back to form interlevel contacts in said second via holes; and, using a standard copper metal-line-and-interconnect process to form the remaining electrical interconnections.

16. The method of claim 15, wherein said first insulating layer is silicon oxide deposited by plasma-enhanced chemical vapor deposition to a thickness of between about 1000 and 10000 Angstroms.

17. The method of claim 15, wherein said first and said second etch-stop layers are silicon nitride and are formed to a thickness of between about 100 and 1000 Angstroms.

18. The method of claim 15, wherein said second insulating layer is silicon oxide deposited by plasma-enhanced chemical vapor deposition to a thickens of between about 1000 and 10000 Angstroms.

19. The method of claim 15, wherein said third insulating layer is silicon oxide deposited by plasma-enhanced chemical vapor deposition to a thickens of between about 1000 and 10000 Angstroms.

20. The method of claim 15, wherein said first and said second barrier layers are tantalum and are formed to a thickness of between about 100 and 1000 Angstroms, and wherein said first and said second copper seed layers are formed to a thickness of between about 500 and 2000 Angstroms.

21. The method of claim 15, wherein said first copper layer is electroplated to a thickness sufficient to fill said first and said second recesses, and is polished back to said third insulating layer.

22. The method of claim 15, wherein said capacitor dielectric layer is a material selected from the group that includes silicon nitride, silicon carbide, silicon dioxide, nitrogen-doped silicon carbide, and oxygen-doped silicon carbide and is formed to a thickness of between about 100 and 1000 Angstroms.

23. The method of claim 15, wherein said metal layer is tantalum deposited by physical vapor deposition to a thickness of between about 100 and 1000 Angstroms.

24. The method of claim 15, wherein said third etch-stop layer is silicon nitride and is formed to a thickness of between about 100 and 1000 Angstroms.

25. The method of claim 15, wherein said capacitor dielectric layer is partially etched to a depth of about 100 to 1000 Angstroms.

26. The method of claim 15, wherein said fourth insulating layer in silicon oxide deposited by plasma-enhanced chemical vapor deposition to a thickness of between about 1000 and 10000 Angstroms.

27. The method of claim 15, wherein said second via holes arm etched selectively to said third insulating layer on said capacitor top plates using anisotropic plasma etching having an etch selectivity between silicon oxide and silicon nitride of about 15:1.

28. The method of claim 15, wherein said second copper is electroplated to a thickness sufficient to fill said second via holes, and in polished back to said fourth insulating layer.

29. The method of claim 15, wherein said MIM capacitor is utilized as an anti-fuse on said substrate by applying a voltage that is greater than the dielectric breakdown voltage of said capacitor dielectric layer between said capacitor top and bottom plates.

30. The method of claim 29, wherein said voltage is greater than about 5 volts.

* * * * *